(12) United States Patent
Koike et al.

(10) Patent No.: US 7,915,802 B2
(45) Date of Patent: Mar. 29, 2011

(54) SURFACE LIGHT EMITTING DEVICE AND POLARIZATION LIGHT SOURCE

(75) Inventors: Yasuhiro Koike, Kanagawa (JP); Hiroki Tsujimura, Kyoto (JP); Satoshi Nakagawa, Kyoto (JP)

(73) Assignees: Rohm Co., Ltd., Kyoto (JP); Keio University, Tokyo (JP)

( * ) Notice: Subject to any disclaimer, the term of this patent is extended or adjusted under 35 U.S.C. 154(b) by 251 days.

(21) Appl. No.: 12/269,386

(22) Filed: Nov. 12, 2008

(65) Prior Publication Data
US 2009/0168453 A1 Jul. 2, 2009

(30) Foreign Application Priority Data

Nov. 12, 2007 (JP) ................................ P2007-293624
Nov. 12, 2007 (JP) ................................ P2007-293630
Nov. 7, 2008 (JP) ................................ P2008-286128

(51) Int. Cl.
*H01J 1/62* (2006.01)
*H01J 61/35* (2006.01)

(52) U.S. Cl. ......................... 313/498; 359/487; 313/113
(58) Field of Classification Search .......... 313/598–512, 313/110–113; 349/123, 141, 124; 359/487, 359/485
See application file for complete search history.

(56) References Cited

U.S. PATENT DOCUMENTS
6,704,082 B2 * 3/2004 Tomioka et al. .............. 349/123

OTHER PUBLICATIONS

T. Takeuti et al. Japanese Journal of Applied Physics vol. 39, 2000, p. 413-416.

* cited by examiner

*Primary Examiner* — Joseph L Williams
(74) *Attorney, Agent, or Firm* — Rabin & Berdo, PC

(57) ABSTRACT

A surface light emitting device includes a polarized light source that emits polarized light; and a light guide plate including a light incident surface on which the polarized light emitted from the polarized light source is made incident, and a light emitting surface that emits light, the light guide plate being made of light transmissive resin having low birefringence in which retardation is one-fourth or less of a wavelength of the polarized light.

19 Claims, 7 Drawing Sheets

SEMIPOLAR PLANE

{01$\bar{1}$1}

SEMIPOLAR PLANE

{01$\bar{1}$3}

1

SURFACE LIGHT EMITTING DEVICE AND POLARIZATION LIGHT SOURCE

CROSS REFERENCE TO RELATED APPLICATIONS AND INCORPORATION BY REFERENCE

This application is based upon and claims the benefit of priority from prior Japanese Patent Application P2007-293624 filed on Nov. 12, 2007, prior Japanese Patent Application P2007-293630 filed on Nov. 12, 2007, and prior Japanese Patent Application P2008-286128 filed on Nov. 7, 2008; the entire contents of which are incorporated by reference herein.

BACKGROUND OF THE INVENTION

1. Field of the Invention

The present invention relates to a light emitting device, and particularly, relates to a surface light emitting device and a polarized light source, which emit polarized light.

2. Description of the Related Art

In recent years, a light emitting element that emits polarized light has been developed. A polarized light source including such a light emitting element is used as a light source of a liquid crystal display or a front-type projector, whereby a light utilization efficiency of the liquid crystal display or the front-type projector can be enhanced. A reason for this is as follows. Specifically, such a display device as the liquid crystal display includes a pair of polarizing plates arranged so as to sandwich a liquid crystal cell therebetween, and accordingly, if the polarized light is emitted from the light emitting device, then a light component that can pass through the polarizing plate located on a front side of the liquid crystal cell is increased, and hence, a quantity of light that can pass through the liquid crystal cell is increased.

The above is described below with reference to FIG. 1. As shown in FIG. 1, as a surface light emitting device 110 of a liquid crystal display 100, there is proposed a backlight including: a polarized light source 111 that emits polarized light 150; and a resin-made light guide plate 112 that receives the polarized light 150 emitted from the polarized light source 111, disperses the received polarized light 150 in an inside thereof, and uniformly emits light 160 from a light emitting surface 112a. In FIG. 1, polarizing plates 120 and 140 are polarizing plates arranged to sandwich a liquid crystal cell 130 therebetween.

In usual, the resin-made light guide plate 112 shown in FIG. 1 is manufactured by molding resin such as acrylic resin into a predetermined shape by a method such as injection molding. At the time of molding the resin, orientation of molecules occurs in the resin. Moreover, also in the case of thermally curing the resin after the molding, the orientation occurs in the resin molecules, and a residual stress is generated in the light guide plate. The occurrence of the orientation of the resin molecules and the generation of the residual stress allow appearance of birefringence in the inside of the light guide plate. When the birefringence appears in the resin composing the light guide plate, polarization characteristics are disturbed by the fact that the polarized light generated in the polarized light source passes through the light guide plate. As a result, the polarized light nearly becomes random polarized light. Hence, in actual, the light 160 radiated from the light guide plate 112 shown in FIG. 1 cannot maintain the polarization characteristics, and an advantage brought by using the polarized light source 111 that emits the polarized light 150 cannot be fully utilized. Incidentally, in the case of transmitting the random polarized light through the polarizing plate, intensity of light that has passed through the polarizing plate is attenuated to approximately 35%.

Besides the above-described problem in the light guide plate 112, a similar problem is inherent in the polarized light source 111 as a package. Specifically, in a similar way to the manufacture of the light guide plate 112, also in the process of manufacturing the polarized light source 111, at the time of thermally curing sealing resin, such as epoxy resin and silicon resin, that seals a light emitting element (not shown), the orientation occurs in molecules of the sealing resin, and the residual stress is generated in the sealing resin. The occurrence of the orientation of the resin molecules and the generation of the residual stress allow appearance of the birefringence in an inside of the sealing resin. When the birefringence appears in the sealing resin, the polarization characteristics are disturbed by the fact that the polarized light generated in the light emitting element passes through the sealing resin. Hence, the polarization characteristics of the polarized light radiated from the polarized light source 111 as a package cannot be maintained, and the advantage brought by using the light emitting element that emits the polarized light cannot be fully utilized.

As a result, in the light 160 emitted from the light guide plate 112, a light component that cannot pass through the polarizing plate 120 is increased, and light 170 with a small light quantity passes through the liquid crystal cell 130. Then, a light component that can pass through the polarizing plate 140 as an analyzer is further decreased. Therefore, brightness of display in the liquid crystal display 100 is low, and a contrast thereof is also decreased.

SUMMARY OF THE INVENTION

An aspect of the present invention is a surface light emitting device including a polarized light source that emits polarized light; and a light guide plate including a light incident surface on which the polarized light emitted from the polarized light source is made incident, and a light emitting surface that emits light, the light guide plate being made of light transmissive resin having low birefringence in which retardation is one-fourth or less of a wavelength of the polarized light.

Another aspect of the present invention is a polarized light source including a light emitting element that emits polarized light; a package base on which the light emitting element is mounted; and a sealing portion that is made of light transmissive resin having low birefringence in which retardation is one-fourth or less of a wavelength of the polarized light, and covers the light emitting element.

DETAILED DESCRIPTION OF THE INVENTION

Figure 1:
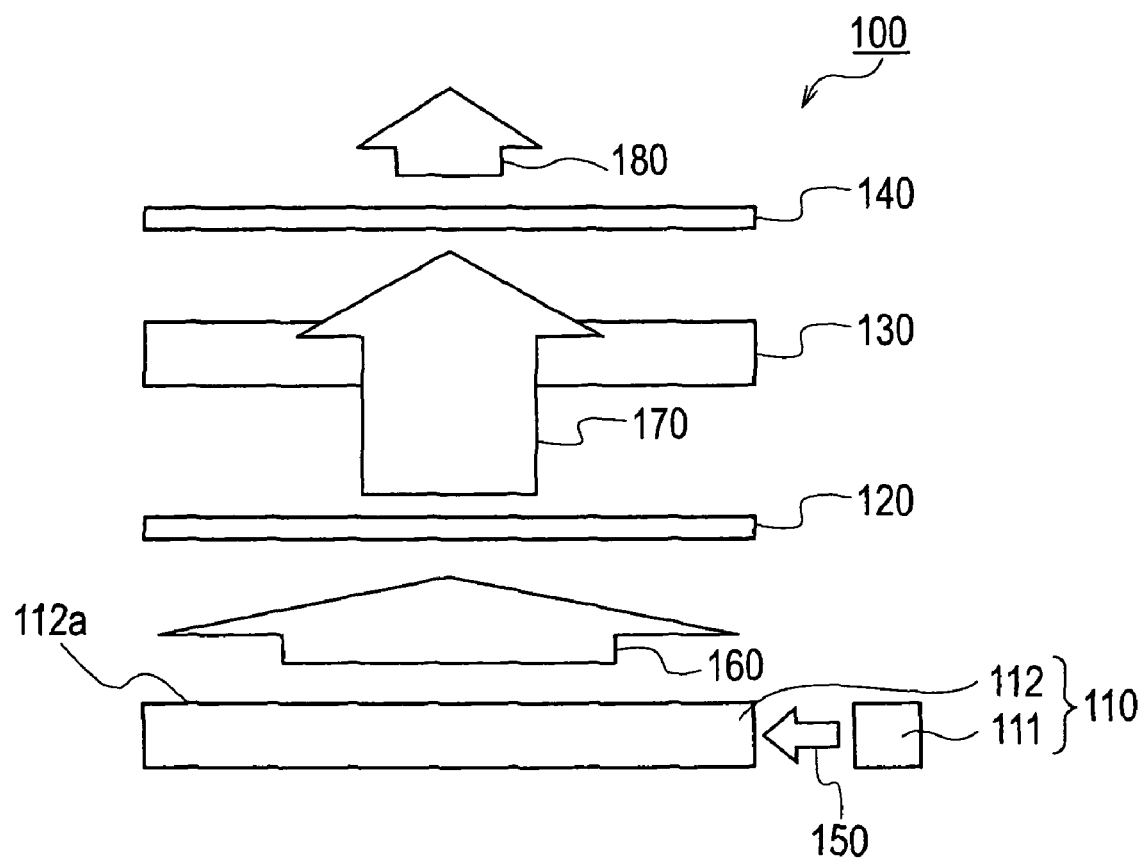
FIG. 1 is a schematic view showing a liquid crystal display using a surface light emitting device of the related art.

A description is made below of details of a surface light emitting device and a polarized light source, which are according to an embodiment of the present invention, while referring to the drawings.

The embodiment of the present invention is one in which the present invention is applied to a surface light emitting device including a polarized light source that uses a light emitting diode (LED) as a light emitting element and has a surface package structure, and including a resin-made light guide plate.

[Configuration of Surface Light Emitting Device]

Figure 2:
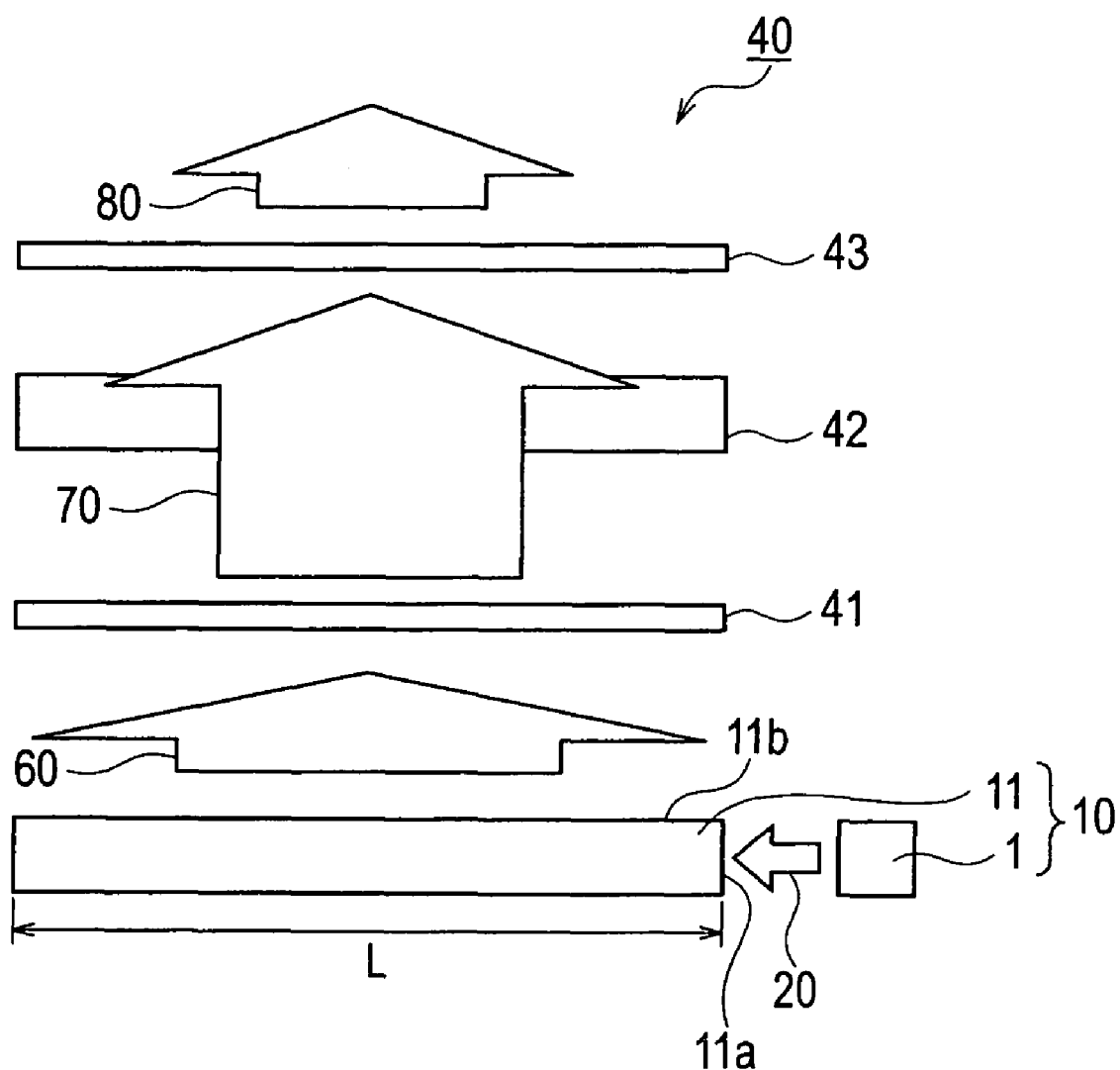
FIG. 2 is a schematic view showing a liquid crystal display including a surface light emitting device according to an embodiment of the present invention.

As shown in FIG. 2, a surface light emitting device 10 includes a polarized light source 1 and a light guide plate 11. As shown in FIG. 2, the surface light emitting device 10 can be incorporated as a backlight into a liquid crystal display 40. The liquid crystal display 40 includes: the surface light emitting device 10; a polarizing plate 41 as a polarizer; a liquid crystal cell 42 formed by filling liquid crystal between a pair of glass substrates; and a polarizing plate 43 as an analyzer. The liquid crystal cell 42 may be either an active matrix liquid crystal display (LCD) or a passive matrix LCD. Moreover, a color filter and a phase difference plate may be provided as other constituents of the liquid crystal cell 42.

The light guide plate 11 is a resin plate formed of a low-birefringent light transmissive material having birefringence in which retardation is one-fourth or less of a light source wavelength. As shown in FIG. 2, in the light guide plate 11, one of side surfaces is a light incident surface 11a opposite to the polarized light source 1. Polarized light 20 is made incident onto the light incident surface 11a. A front surface of the light guide plate 11 is a light emitting surface 11b that uniformly emits polarized light 60. Reference symbol L shown in FIG. 1 denotes a light guide length.

The "retardation" refers to a phase shift between two polarizing components, which is caused when light transmits through a substance. In general, the retardation is represented by the following expression (1) or (2):

Retardation=$2\Pi d\Delta n/\lambda$ (1)

Retardation=$d\Delta n$ (2)

where $\Delta n$ is an orientation birefringence index (not an inherent refractive index), d is a thickness of the substance through which the light transmits, and $\lambda$ is a wavelength of the light in a vacuum. As described above, as the thickness d as a distance by which the light transmits is thicker, the retardation is increased. Details of the low-birefringent light transmissive material will be described later.

In a similar way to a well-known backlight system, the surface light emitting device 10 may include a lamp reflector (not shown) that surrounds the light incident surface 11a of the light guide plate 11 and the polarized light source 1 and prevents leakage of the light, a reflection sheet (not shown) disposed on a back side surface of the light guide plate 11, and the like. The surface light emitting device 10 may also include an optical film between the light guide plate 11 and the polarizing plate 41.

[Configuration of Polarized Light Source]

Figure 3:
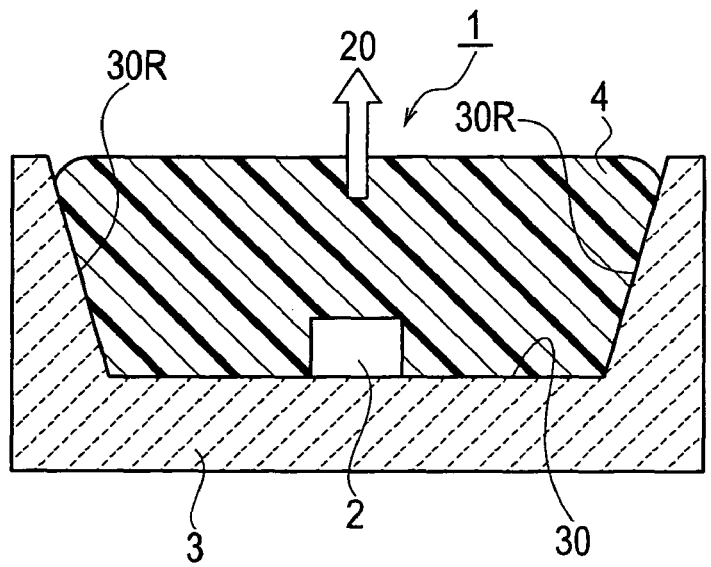
FIG. 3 is a cross-sectional view of a polarized light source according to the embodiment of the present invention.

As shown in FIG. 3, the polarized light source 1 includes: a light emitting element 2 that emits the polarized light; a package base 3 on which the light emitting element 2 is packaged; and a sealing portion 4 that covers the light emitting element 2. It is preferable that the sealing portion 4 be sealing resin made of the low-birefringent light transmissive material having the birefringence in which the retardation is one-fourth or less of a wavelength of the polarized light 20 emitted by the light emitting element 2.

The package base 3 is a package substrate with a surface package structure, and has a package surface 30 that has a recessed shape in cross section and also serves as a reflector 30R. The light emitting element 2 is packaged on a bottom surface in the package surface 30 of the package base 3. Moreover, on a periphery of a side surface of the light emitting element 2 in the package base 3, the reflector 30R formed of an inner circumferential side surface of such a recessed portion of the package base 3 is composed.

[Configuration of Light Emitting Element]

The light emitting element 2 is an LED that emits the polarized light 20. The "polarized light" stands for light in which a linear polarizing component is not uniform (random) but biased. However, in this embodiment, it is not necessary that the polarized light be the complete linear polarized light. Hence, a polarized direction of the polarized light 20 is a direction indicated by the largest linear polarizing component.

Figure 4:
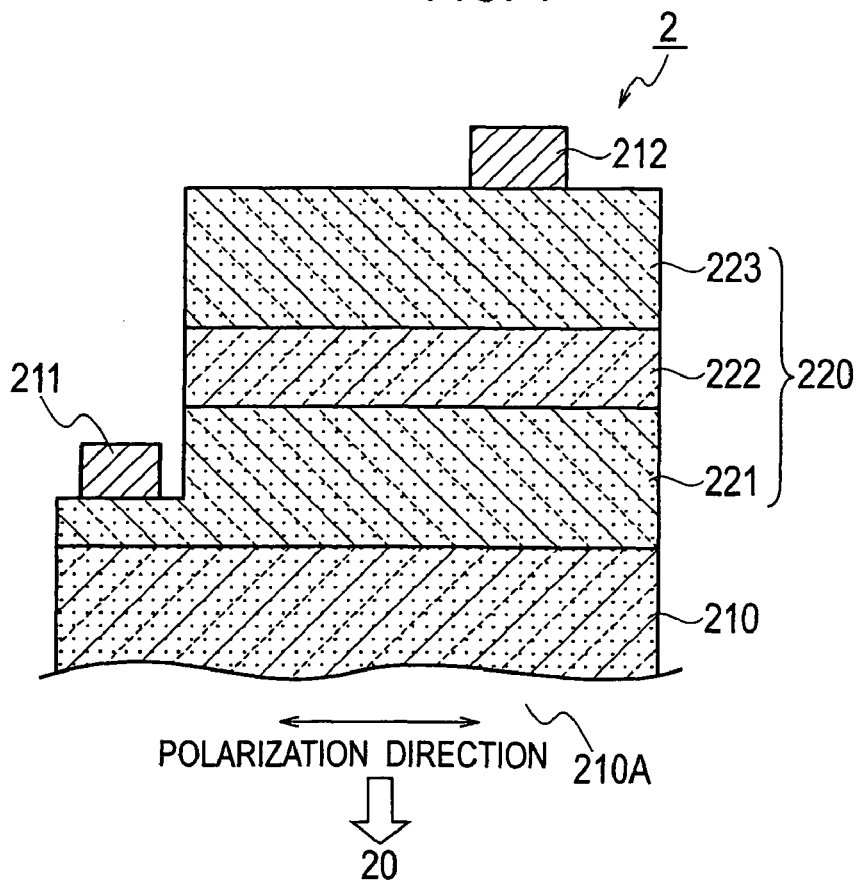
FIG. 4 is a cross-sectional explanatory view of a light emitting element used in the polarized light source according to the embodiment of the present invention.

For example as shown in FIG. 4, the light emitting element 2 includes: a light emitting portion 220 that generates the polarized light 20; and an output portion 210 as a substrate on which the light emitting portion 220 is mounted.

The light emitting portion 220 uses, as a crystal growing surface, a non-polar plane or semi-polar plane of GaN crystal. The light emitting portion 220 is formed in such a manner that a first conductive-type first semiconductor layer 221, an active layer 222 and a second conductive-type second semiconductor layer 223 are sequentially stacked on one another in a normal direction with respect to the crystal growing surface. For example, if the crystal growing surface of the light emitting portion 220 is an m-plane as the non-polar plane, then the light emitting element 2 is composed of a group III nitride semiconductor using the m-plane as a principal plane. As the group III nitride semiconductor, for example, there are aluminum nitride (AlN), gallium nitride (GaN), indium nitride (InN), and the like. A typical group III nitride semiconductor is represented by $Al_xIn_yGa_{1-x-y}N$ ($0 \leq x \leq 1$, $0 \leq y \leq 1$, $0 \leq x+y \leq 1$). A GaN semiconductor is a well-known III-V group compound semiconductor among hexagonal compound semiconductors containing nitrogen.

A light emission wavelength (wavelength in which light emission intensity is the maximum) of the light emitting element 2 is adjusted by changing an indium (In) composition in the active layer 222. The light emitting element 2 of this embodiment is, for example, a blue light emitting element in which the light emission wavelength is 400 nm. However, the light emitting element 2 is not limited to this, and for example, may be a green light emitting element in which the light emission wavelength is approximately 530 nm, or light emitting elements in each of which the light transmission wavelength is other than the above.

First conductive-type carriers are supplied to the active layer 222 from the first semiconductor layer 221, and second conductive-type carriers are supplied thereto from the second semiconductor layer 223. In the case where the first conductive type is the n-type, and the second conductive type is the p-type, then recombination of electrons supplied from the first semiconductor layer 221 and holes supplied from the second semiconductor layer 223 is performed, and the polarized light 20 is emitted from the active layer 222. For the active layer 222, for example, a quantum well structure can be adopted, in which a well layer is sandwiched like a sandwich by barrier layers which have a larger band gap than the well layer. The quantum well structure includes a multiplexed quantum well structure in which the number of well layers is not single, and further includes a quantum well structure in which the active layer 222 is formed into a multiplexed quantum well (MQW) structure.

In usual, light extracted from an active layer made of a group III nitride semiconductor using, as the crystal growing surface, a c-plane that is a polar plane of the GaN crystal is in a random polarized (non-polarized) state. Meanwhile, in the active layer 222 formed by using the group III nitride semiconductor using, as the crystal growing surface, the non-polar plane such as an a-plane (refer to FIG. 5) and an m-plane or the semi-polar plane, which are other than the c-plane, light in a strong polarized state is generated. For example, in the case where the active layer 222 is formed by using the m-plane as the principal plane, the polarized light 20 containing a large quantity of a polarizing component parallel to the m-plane, that is, a polarizing component in an a-axis direction is emitted from the active layer 222. Details of the non-polar plane and the semi-polar plane will be described later.

The light emitting portion 220 is formed by being grown by crystal growth on the crystal growing surface of the output portion 210. As shown in FIG. 4, the light emitting element 2 includes the output portion 210, and further includes the first semiconductor layer 221 on the output portion 210, the active layer 222 on the first semiconductor layer 221, and the second semiconductor layer 223 on the active layer 222.

In this embodiment, the output portion 210 is composed, for example, of a GaN single crystal substrate. In the case where the principal plane of the output portion 210, which becomes the crystal growing surface, is the m-plane, the light emitting portion 220 can be formed on this principal plane by the crystal growth. Specifically, the light emitting portion 220 is composed of a GaN film formed on the m-plane taken as the crystal growing surface, and the light emitting element 2 is composed of the group III nitride semiconductor grown on the m-plane taken as the crystal growing surface. The principal plane of the output portion 210 is the same as the crystal growing surface of the light emitting portion 220.

The light emitting element 2 further includes: a first electrode 211 that supplies an operation voltage to the first semiconductor layer 221; and a second electrode 212 that supplies an operation voltage to the second semiconductor layer 223. As shown in FIG. 4, the first electrode 211 is disposed on the surface of the first semiconductor layer 221, which is exposed in such a manner that regions of the second semiconductor layer 223, the active layer 222 and the first semiconductor layer 221 are partially removed by mesa etching. The first semiconductor layer 221 and the first electrode 211 are electrically connected to each other. The second semiconductor layer 223 and the second electrode 212 are electrically connected to each other.

For example, aluminum (Al) is used for the first electrode 211, and for example, a palladium (Pd)-gold (Au) alloy is used for the second electrode 212. The first electrode 211 is ohmically connected to the first semiconductor layer 221, and the second electrode 212 is ohmically connected to the second semiconductor layer 223. Note that a first conductive-type contact layer may be interposed between the first semiconductor layer 221 and the first electrode 211. Moreover, a second conductive-type contact layer may be interposed between the second semiconductor layer 223 and the second electrode 212.

In the light emitting element 2, a surface (back surface) of the output portion 210, which is opposite with the crystal growing surface (principal plane) thereof in contact with the first semiconductor layer 221, is an output surface 210A. The polarized light 20 emitted from the active layer 222 is outputted as output light from the output surface 210A to the outside of the light emitting element 2. Note that the light emitting element 2 can also output the light from the second semiconductor layer 223 side. In this embodiment, the light emitting element 2 is electrically connected onto the package surface 30 of the package base 3 through a bump electrode (not shown), and by the flip-chip method, the light emitting element 2 is packaged on the package base 3.

[Crystal Structure of Light Emitting Element]

Figure 5:
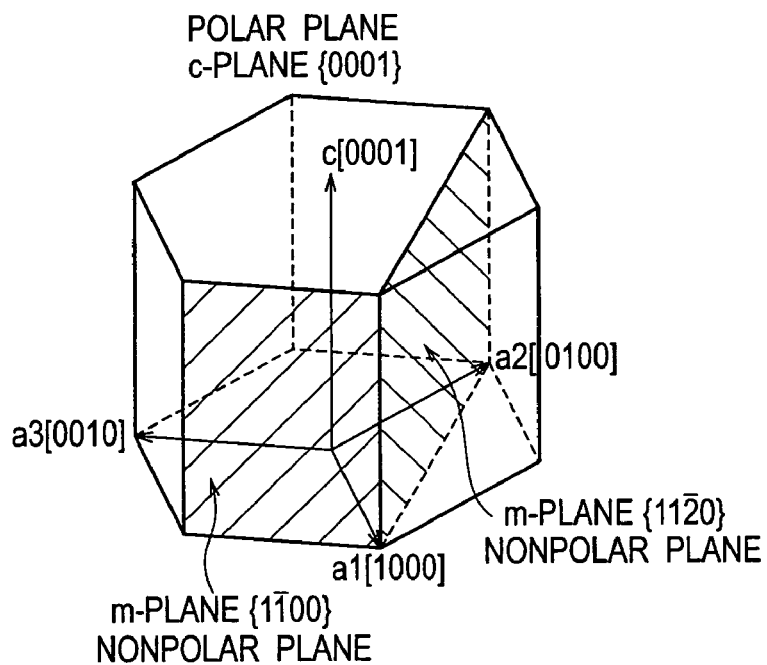
FIG. 5 is a crystal structure diagram explaining non-polar planes of a group III nitride semiconductor.
Figure 6:
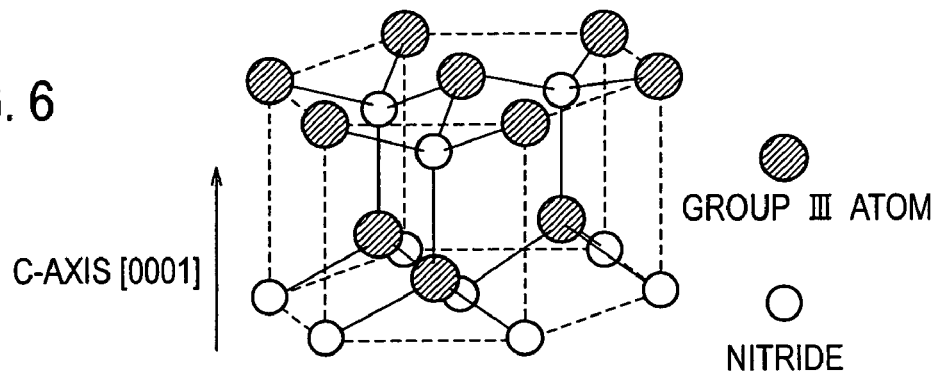
FIG. 6 is a crystal structure diagram explaining an atomic arrangement of the group III nitride semiconductor.

As shown in FIG. 5 and FIG. 6, a crystal structure of a unit cell of the group III nitride semiconductor that composes the light emitting element 2 approximates to the hexagonal crystal structure. In the hexagonal crystal structure, the c-axis is a crystal axis that goes along an axis direction of a hexagonal column. A plane (top plane of the hexagonal column) in which the c-axis is taken as a normal line is a c-plane {0001}. When the crystal of the group III nitride semiconductor is subjected to cleavage on two planes parallel to the c-plane, the +c-axis-side plane (+c-plane) becomes a crystal surface in which group III atoms are arrayed. The −c-axis-side plane (−c-plane) becomes a crystal surface in which nitrogen atoms are arrayed. Therefore, the c-plane exhibits different properties between the +c-axis side and the −c-axis side, and is called a polar plane.

As shown in FIG. 6, four nitrogen atoms are bonded to one group III atom. The four nitrogen atoms are located on four vertices of a regular tetrahedron in which the group, III atom is disposed in a center. Among these four nitrogen atoms, one nitrogen atom is located in the +c-axis direction with respect to the group III atom, and the other three nitrogen atoms are located on the −c-axis side with respect to the group III atom. Since the group III nitride semiconductor has the crystal structure as described above, the polarized direction goes along the c-axis in the group III nitride semiconductor.

Figure 7A:
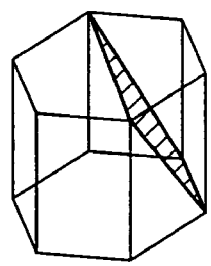
FIGS. 7A and 7B are crystal structure diagrams explaining semi-polar planes of the group III nitride semiconductor.
Figure 7B:
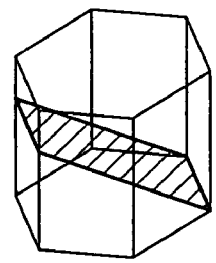

In the hexagonal crystal structure, each of side planes of the hexagonal column is the m-plane {1-100}. A plane that passes through a pair of edge lines which are not adjacent to each other is an a-plane {11-20}. The m-plane and the a-plane are crystal planes perpendicular to the c-plane, and are orthogonal to a polarized direction, and accordingly, are planes which do not have polarity, that is, non-polar planes. Moreover, crystal planes inclined with respect to c-plane (that is, neither parallel nor perpendicular to the c-plane) obliquely intersect the polarized direction, and accordingly, are planes which have some polarity, that is, semi-polar planes. Specific examples of the semi-polar planes are a {01-11} plane shown in FIG. 7A, a {01-13} plane shown in FIG. 7B, and the like.

[Constituent Materials of Light Guide Plate and Sealing Portion]

The light guide plate 11 and the sealing portion 4 are made of a resin material that has light transmission properties, and has the low birefringence in which the retardation is one-fourth or less of the light source wavelength. The resin material having the low birefringence, which is used in this embodiment, is a polymer having properties in which birefringence characteristics does not appear even though orientation characteristics appear as a result of performing injection molding or extrusion molding therefor. Note that, preferably, light scattering microparticles and voids are not mixed into the polymer.

In this embodiment, the light transmissive substance having the low birefringence characteristics in which the retardation is one-fourth or less of the light source wavelength is a mixture or copolymer of a positive birefringent substance and a negative birefringent substance.

It is preferable that the positive birefringent substance be selected, for example, from polyvinylidene fluoride (PVDF), polyvinylidene fluoride trifluoroethylene (VDF·TrFE-58), polyethylene oxide (PEO) and the like.

It is preferable that the negative birefringent substance be polymethyl methacrylate (PMMA); however, is not limited thereto. Note that each of the positive and negative birefringent substances may be a single type substance or a combination of a plurality of the substances.

The low-birefringent light transmissive substance in which the retardation is one-fourth or less of the light source wavelength may be one in which a low-molecular organic substance having a stick-like molecular shape and having anisotropy in polarizability is added to the polymer, and consequently has the low-birefringence characteristics in which the retardation is one-fourth or less of the light source wavelength. Alternatively, the low-birefringent light transmissive substance may be one in which inorganic birefringent crystal microparticles are added to the polymer, and consequently, the low-birefringence characteristics in which the retardation is one-fourth or less of the light source wavelength is provided.

It is widely known that polymer resin materials have birefringence characteristics. With regard to almost all of the polymer resin materials usually used as optical materials, monomers which form the polymers concerned have optical anisotropies on refractive index. The optical anisotropies of the monomers appear in accordance with alignment of the monomers in a fixed direction, that is, the orientation, whereby the birefringence characteristics are generated in the polymer resin materials.

When the polymers are subjected to a molding process of the injection molding or the extrusion molding, polymer bonding chains which have been random are oriented, and as a result, the polymers come to exhibit the birefringence characteristics. Therefore, almost all of the polymer resin materials usually used as the optical materials have the birefringence characteristics. Such birefringence is generally referred to as orientation birefringence.

Moreover, the polymer resin materials sometimes express the birefringence also at the time of elastic deformation. The birefringence in this case is generally referred to as photoelastic birefringence.

In this embodiment, the light guide plate 11 is made of the low-birefringent light transmissive resin in which the retardation is one-fourth or less of the light source wavelength even though the orientation characteristics appear in the inside thereof owing to the injection molding and the extrusion molding, or even though the elastic deformation occurs in the inside owing thereto, or even though both of the orientation and the elastic deformation occur in the inside owing thereto. Moreover, the light emitting element 2 is sealed by using the low-birefringent light transmissive resin as described above, whereby the sealing portion 4 is formed.

A description is made below of the light transmissive resin as such a light transmissive substance that composes the light guide plate 11 and the sealing portion 4.

Light transmissive resin prepared by blending method

A polymer in which an inherent birefringence is positive and a polymer in which an inherent birefringence is negative are blended with each other in an appropriate blend ratio. In such a way, both of the polymers cancel the birefringences each other when the orientation occurs, and in a macroscopic view, the birefringence is not allowed to appear. Combinations of the polymers to be blended are, for example, as shown in Table 1.

TABLE 1

| Polymer (negative birefringent substance/positive birefringent substance) | Composition (weight ratio) |
| --- | --- |
| PMMA/PVDF | 80:20 |
| PMMA/VDF•TrFE-58 | 90:10 |
| PMMA/PEO | 65:35 |

In this embodiment, as the constituent resin of the light guide plate 11 and the sealing portion 4, a PMMA/PVDF mixture prepared by blending the polymethyl methacrylate (PMMA) and the polyvinylidene fluoride (PVDF) with each other in a weight ratio of 80:20 as shown in Table 1 is used.

Moreover, a PMMA/VDF·TrFE-58 mixture prepared by blending the PMMA and the polyvinylidene fluoride trifluoroethylene (VDF·TrFE-58) with each other in a weight ratio of 90:10 as shown in Table 1 may be used for the light guide plate 11 and the sealing portion 4.

Furthermore, the light guide plate 11 and the sealing portion 4 may be formed of a PMMA/PEO mixture prepared by blending the PMMA and the polyethylene oxide (PEO) with each other in a weight ratio of 65:35 as shown in Table 1.

The above-described "inherent birefringence" is an index indicating a degree at which the orientation birefringence is likely to occur for each of the optical resin materials. It is also possible to define the inherent birefringence for a base material containing, as a base material, either of a homopolymer and a copolymer. The orientation birefringence index $\Delta n$, an orientation degree $f$ and the inherent birefringence index $\Delta n0$ are in relationships as shown in the following expressions (3) and (4):

$$\Delta n = f \times \Delta n0 \qquad (3)$$

$$\Delta n0 = \Delta n/f \qquad (4)$$

The orientation degree f is an index indicating a degree of orientation of principal chains of the polymer, and a state where the polymer is completely oriented in a single direction is represented by f=1. In the case where there is no orientation, f is equal to 0. In usual, the orientation degree f is a value smaller than 0.3. A magnitude (added with a positive or negative symbol) of the orientation birefringence at this time corresponds to the inherent birefringence index $\Delta n0$.

Meanwhile, the photoelastic birefringence index $\Delta nE$ is represented by an expression (5) by using a principal stress difference σ (difference between both of two principal stresses orthogonal to each other when an applied stress is decomposed thereinto) and a photoelastic coefficient C inherent in the substance:

$$\Delta nE = C \cdot \sigma \qquad (5)$$

Light transmissive resin created by random copolymerization method

A monomer of a polymer in which an inherent birefringence is positive and a monomer of a polymer in which an inherent birefringence is negative are copolymerized with each other in an appropriate ratio, whereby polarizability anisotropy is cancelled in one polymer chain. A novel polymer created by such a copolymerization method does not have the birefringence characteristics, and accordingly, does not express the birefringence even though the orientation occurs. As combinations of the monomers to be copolymerized, for example, there are those shown in Table 2.

TABLE 2

| Substance having negative birefringence | Substance having positive birefringence |
|---|---|
| methyl methacrylate<br>styrene<br>butyl methacrylate<br>cyclohexyl methacrylate | trifluoroethyl methacrylate<br>trihydro perfluoropropyl<br>benzyl methacrylate |

As shown in Table 2, as the monomer having the negative birefringence, there are mentioned methyl methacrylate (MMA), styrene, butyl methacrylate (BMA), cyclohexyl methacrylate (CHMA), and the like.

Moreover, as shown in Table 2, as the monomer having the positive birefringence, there are mentioned trifluoroethyl methacrylate (3FMA), trihydro perfluoropropyl (4FMA), benzyl methacrylate (BzMA), and the like.

The light guide plate 11 and the sealing portion 4 may be formed by using the novel polymer created by copolymerizing the monomer having the negative birefringence and the monomer having the positive birefringence with each other, which are as described above.

Light transmissive resin created by anisotropic low-molecular doping method

The birefringence of the polymer is cancelled by adding, to the polymer, a low molecular organic substance having the stick-like molecular shape and the anisotropy in polarizability. Here, a low molecular organic substance having birefringence anisotropy reverse in polarity to the birefringence anisotropy of the polymer is used. Specifically, such a method is adopted, in which several molar percents of trans-stilbene, diphenylacetylene, biphenyl, calbazole or the like are added to the PMMA having the negative orientation birefringence. The light guide plate 11 and the sealing portion 4 may be formed by light transmissive resin created by the anisotropic low-molecular doping method as described above.

The light transmissive resin prepared by each of the above-described respective methods is designed so as not to express the birefringence characteristics even though the orientation characteristics appear in the inside thereof owing to the injection molding and the extrusion molding. Alternatively, the light transmissive resin can also be designed so as not to express the birefringence characteristics even though the elastic deformation occurs therein, or can also be designed so as not to express the birefringence characteristics even though both of the orientation and the elastic deformation occur therein. Therefore, it is possible to adopt a variety of molding methods in the case of molding the light guide plate 11 and the sealing portion 4.

The inherent birefringence index of usual resin, for example, of the PMMA is approximately $-4.3 \times 10^{-3}$. Meanwhile, an absolute value of the inherent birefringence index $\Delta n0$ of the light transmissive substance for use in this embodiment is $3 \times 10^{-3}$ or less. As shown in the expression (3), the orientation birefringence index $\Delta n$ depends on the orientation degree f; however, in the case where the absolute value of the inherent birefringence index $\Delta n0$ is $3 \times 10^{-3}$ or less, the orientation birefringence index $\Delta n$ can be reduced regardless of the orientation degree f that depends on the manufacturing method. The above-described anisotropic low-molecular doping method is a method of canceling the birefringence by adding, to the polymer, the low molecular organic substance having the stick-like molecular shape and the anisotropy in polarizability, and accordingly, in a strict meaning, the inherent birefringence index $\Delta n0$ of the polymer molecular chain itself is the same as that before adding the low molecular organic substance. However, the above-described low molecular organic substance is oriented together with the polymer molecular chain, and accordingly, it may be considered that the birefringence exhibited by the mixture of the polymer and the above-described low molecular organic substance when the orientation degree f of the polymer molecular chain is equal to 1 corresponds to the inherent birefringence index $\Delta n0$. If the consideration is made under such definition, then, in the case where the absolute value of the inherent birefringence index $\Delta n0$ is $3 \times 10^{-3}$ or less, also in the polymer created by the anisotropic low-molecular doping method, the orientation birefringence index $\Delta n$ can be reduced regardless of the orientation degree f that depends on the manufacturing method.

For example, in an MMA/BzMA copolymer and an MMA/3FMA copolymer, a composition ratio of each thereof is adjusted, whereby the orientation birefringence index $\Delta n$ becomes substantially zero in a measurement range of a birefringence measuring apparatus, that is, equal to or less than a measurement limit of the birefringence measuring apparatus. Note that a lower measurement limit of the retardation in accordance with a generally used measuring method is approximately 0.1 nm. The retardation measured from the expression (2) is divided by a thickness (distance by which the light propagates through a sample) of the sample, whereby the birefringence index is obtained. Hence, a lower limit of the obtained birefringence index depends on the thickness of the sample. A lower limit of the birefringence index in the case of performing evaluation thereof by using a film with a thickness of approximately 50 μm (thickness d of the substance through which the light transmits is equal to 50 μm) is approximately $2 \times 10^{-6}$.

The light transmissive resin as described above is used for the light guide plate 11 and the sealing portion 4, whereby the retardation represented by the expression (2) becomes one-fourth or less of the wavelength in this embodiment. A light guide length of the light guide plate 11 is 100 mm, and the retardation at the time when the light is allowed to transmit therethrough in a direction of the light guide length is approximately 50 nm. In this case, the orientation birefringence index $\Delta n$ is approximately $5 \times 10^{-7}$. In this light guide plate, the orientation birefringence index $\Delta n$ can be allowed up to approximately $1 \times 10^{-6}$ with respect to light with a wavelength of 400 nm. The retardation of the sealing portion 4 becomes approximately 5 nm. By the fact that the thickness of the sealing portion is 1 mm, the orientation birefringence index $\Delta n$ is approximately $5 \times 10^{-6}$. In this sealing portion 4, the orientation birefringence index $\Delta n$ can be allowed up to approximately $1 \times 10^{-4}$ with respect to the light with a wavelength of 400 nm.

[Manufacturing Method of Polarized Light Source]

Figure 8:
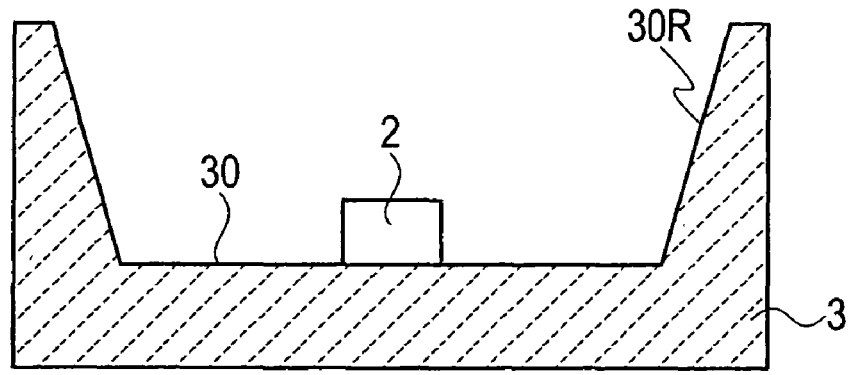
FIGS. 8 to 10 are process cross-sectional views for explaining a manufacturing method of the polarized light source according to the embodiment of the present invention.
Figure 9:
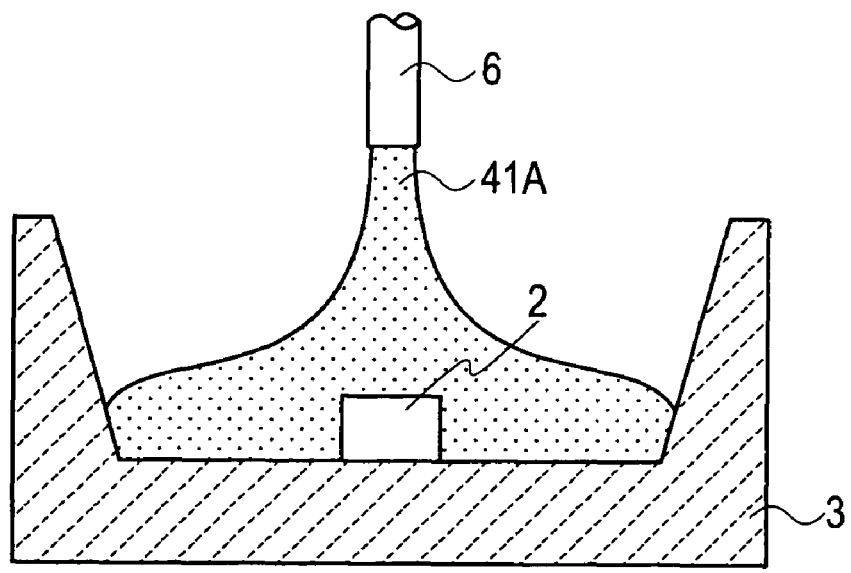
Figure 10:
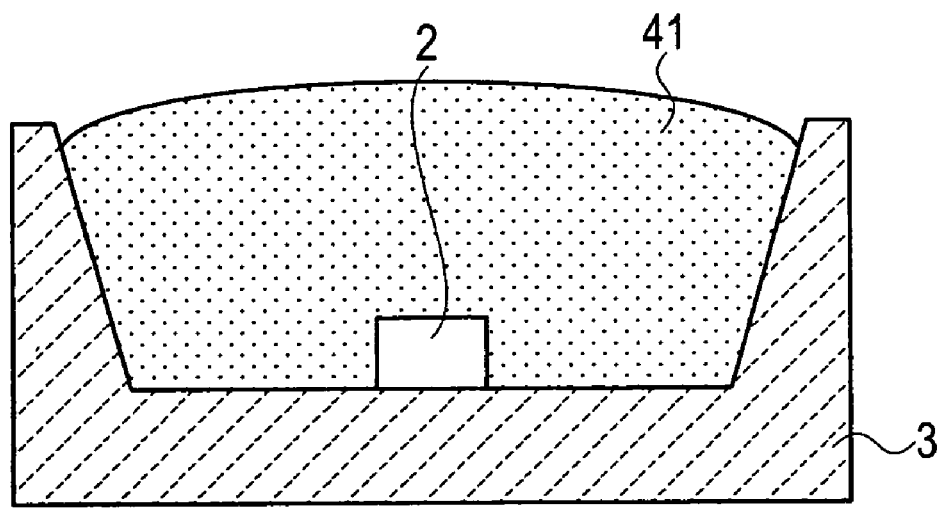

Next, a description is made of an example of a manufacturing method of the polarized light source 1 according to the embodiment with reference to FIG. 8 to FIG. 10.

As shown in FIG. 8, the light emitting element 2 is packaged on the package surface 30 of the package base 3 by the die bonding method. Although not shown here, the first electrode 211 and second electrode 212 of the light emitting element 2 are electrically connected to electrodes arranged on the package surface 30 of the package base 3 at the stage where the light emitting element 2 is packaged on the package base 3.

As shown in FIG. 9, the light transmissive resin 41A prepared by the already described method is dropped and applied from a syringe 6. The light emitting element 2 is sealed by the light transmissive resin 41A.

Thereafter, the light transmissive resin 41A thus dropped and applied is heated step by step, whereby the light transmissive resin 41A is cured, and as shown in FIG. 10, the forming step of the sealing portion 4 is ended.

The light transmissive resin 41A prepared by the above-described method does not express the birefringence characteristics even though the orientation characteristics appear in the inside thereof owing to the injection molding and the extrusion molding. Therefore, besides the above-described method of dropping and applying the light transmissive resin 41A from the syringe 6, a variety of molding methods such as the injection molding and the extrusion molding can be used. In such a way, sealing for a shape that has been unrealizable by the conventional resin molding method can be accomplished while maintaining a polarized state of the LED. Moreover, sealing using the existing molding apparatus becomes possible, and accordingly, an additional capital investment is not required, leading to cost reduction.

By the manufacturing method as described above, the polarization characteristics of the entire package can be maintained in a state where the light emitting element 2 having the polarization characteristics is sealed therein.

In accordance with this embodiment, the sealing portion 4 is formed of the low-birefringent light transmissive resin in which the retardation is one-fourth or less of the wavelength of the polarized light 20. Therefore, the polarized light source 1 that suppresses polarization disturbance of the polarized light 20 emitted from the light emitting element 2 can be realized. Moreover, the light guide plate 11 is formed of the low-birefringent light transmissive resin, whereby polarization disturbance of the polarized light 60 emitted from the light emitting surface 11b of the light guide plate 11 is suppressed.

Moreover, in accordance with this embodiment, the surface light emitting device 10 is used as a light source for the backlight of the liquid crystal display 40, whereby a light quantity of polarized light 70 that transmits through the polarizing plate 41 located on the surface light emitting device 10 side in the liquid crystal display 40 as shown in FIG. 2 is increased. Hence, a light quantity of polarized light 80 that can pass through the polarizing plate 43 is also increased, whereby the liquid crystal display with high display quality can be realized.

Furthermore, in accordance with this embodiment, the surface light emitting device 10 maintains the polarization characteristics by the entirety of the package thereof, and accordingly, it is possible to omit the polarizing plate 41 of the liquid crystal display device 40. Therefore, it becomes possible to reduce cost and manufacturing steps by thinning the liquid crystal display 40, saving a space and omitting the polarizing plate 41. In particular, in accordance with this embodiment, since light utilization efficiency is increased, power consumption of a mobile instrument including the liquid crystal display, for example, such as a cellular phone, a PDA and a notebook personal computer is reduced, and a drive time per one charge is extended to a large extent.

Moreover, in accordance with this embodiment, the polarized light 60 emitted from the light guide plate 11 can be ultimately formed into nearly perfect polarized light, and accordingly, it is possible to raise transmission light intensity to approximately 70%. As a result, light that is double the light in the case of using the random polarized light can be allowed to transmit through the light guide plate 11. Therefore, in the case of setting brightness of the liquid crystal display at a predetermined value, brightness of the polarized light source 1 can be halved by using the light guide plate 11 having the low birefringence in which the retardation is one-fourth or less of the light source wavelength. Hence, in accordance with this embodiment, an effect of reducing the power consumption is brought. In the case of driving the liquid crystal display by the same drive power, the brightness of the display becomes approximately double. As utilization examples of the LCD module as described above, there are mentioned the liquid crystal display of a compact portable information terminal such as the cellular phone, the PDA and the notebook personal computer, a front-type projector, and the like.

Figure 11:
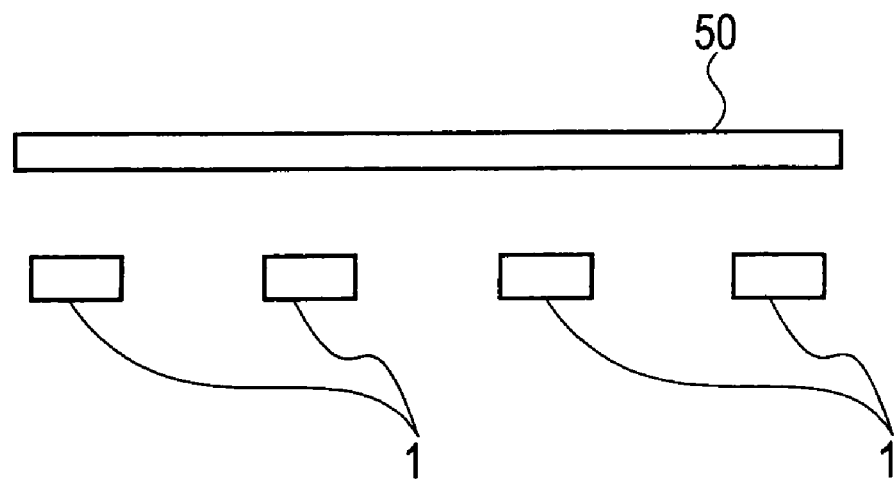
FIG. 11 is a schematic view showing another example of the surface light emitting device using the polarized light source according to the embodiment of the present invention.

If an immediately under-type backlight mode is adopted, in which the polarized light sources 1 are placed immediately under a diffusion plate 50 on the back surface of the liquid crystal display as shown in FIG. 11, then the light guide plate is unnecessary unlike the conventional method of placing the polarized light source 1 by the side of the liquid crystal display. Therefore, it is possible to further thin the liquid crystal display and to further reduce the cost thereof.

In accordance with this embodiment, the polarized light source 1 can be used also as a light source of a sensor using the polarized light. Although a semiconductor laser also emits the polarized light, the semiconductor laser involves a risk in the case of being used as the light source of such a daily used sensor, and it is apprehended that an object to be irradiated thereby may be damaged. As opposed to this, the polarized light source 1 according to this embodiment is excellent in terms of versatility and safety. As the sensor as described above, for example, the birefringence measuring apparatus is mentioned. The birefringence measuring apparatus is an apparatus that measures birefringence characteristics of an object by irradiating the object with the polarized light and measuring a polarized state of light that has passed through the object.

[Modification of Polarized Light Source]

Figure 12:
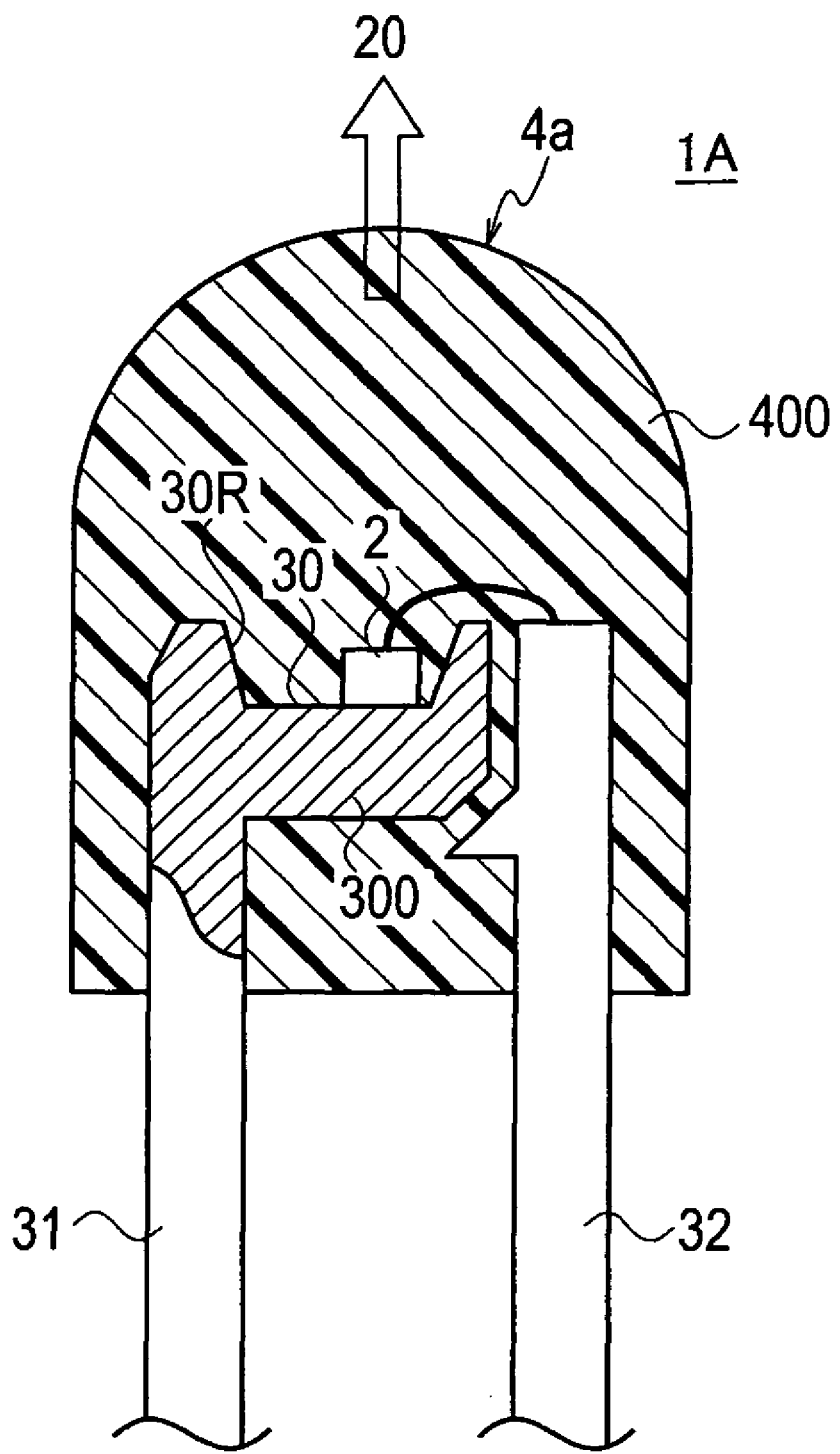
FIG. 12 is a cross-sectional view showing a modification example of the polarized light source in the surface light emitting device according to the embodiment of the present invention.

FIG. 12 shows a modification of the polarized light source 1 in this embodiment. A polarized light source 1A shown in FIG. 12 includes a cannonball-type package structure. As shown in FIG. 12, the polarized light source 1A according to the modification of this embodiment includes: a package base 300; the light emitting element 2 that is packaged on the package base 300 and emits the polarized light 20; and a sealing portion 400 that covers the light emitting element 2 and is made of light transmissive resin transmitting therethrough the polarized light 20 emitted from the light emitting element 2.

As shown in FIG. 12, the package base 300 is disposed on one end of a lead 31, and is composed integrally with the lead 31. In the modification shown in FIG. 12, the lead 31 is used as a cathode electrode. A basic configuration of the package base 300 is similar to that of the package base 3 of the polarized light source shown in FIG. 3, and the package base 300 includes the package surface 30 that has the recessed shape in cross section and also serves as the reflector 30R. The light emitting element 2 is packaged on the bottom surface of the package surface 30 of the package base 300. On the periphery of the side surface of the light emitting element 2 thus packaged, the reflector 30R formed as a tapered surface is composed on the package base 300. In a region close to the lead 31, a lead 32 is disposed. The lead 32 is used as an anode electrode, and one end of the lead 32 is electrically connected to the light emitting element 2 through a wire.

The sealing portion 400 covers the package base 300 on the one end of the lead 31 and the one end of the lead 32, and has a semispherical lens portion 4a above the light emitting element 2, that is, on a portion through which the polarized light 20 emitted from the light emitting element 2 transmits. In a similar way to the sealing portion 4 of the polarized light source 1, which is shown in FIG. 3, the sealing portion 400 shown in FIG. 12 is formed of the low-birefringent light transmissive resin in which the retardation is one-fourth or less of the light source wavelength.

As a molding method of the sealing portion 400, a variety of molding methods can be used, which include: the method of dropping and applying resin from a syringe; a molding method using a dispenser; the injection molding; the extrusion molding; and the like.

Other Embodiments

It should not be understood that the description and the drawings, which form a part of the disclosure of the above-described embodiment, limit this invention. From this disclosure, a variety of alternative embodiments, examples and operation technologies will be obvious for those skilled in the art.

For example, though the example of assembling the one polarized light source 1 to the light guide plate 11 in the surface light emitting device 10 has been described in the above-described embodiment, a configuration may be adopted, in which a plurality of the polarized light sources 1 are arranged on the periphery of the light guide plate 11. Moreover, a configuration may be adopted, in which polarized light sources which emit red light, green light and blue light are used as the polarized light sources 1, and a color filter is omitted in the liquid crystal cell.

Moreover, in the above-described respective embodiments, a configuration may be adopted, in which not only the transparent light transmissive resin is used as the constituent resin of the sealing portion 4 on the polarized light source 1, but also pigment of red color, green color, blue color, orange color or the like is mixed into the light transmissive resin.

In the above-described embodiment, the sealing portion 4 of the polarized light source 1 is formed of the low-birefringent light transmissive resin in which the retardation is one-fourth or less of the light source wavelength; however, a polarized light source that does not include the above-described sealing portion 4 may be used as long as the polarized light source can emit the polarized light. Even if the polarized light source does not include the sealing portion 4 formed of the low-birefringent light transmissive resin, the light quantity of the polarized light that passes to the liquid crystal cell 42 side can be increased by providing the light guide plate 11 having the above-described configuration. Specifically, in the present invention, the disturbance of the polarized light can be suppressed to a large extent in the light guide plate, and accordingly, the light utilization efficiency can be enhanced even in the case of using a polarized light source that emits light in which the polarized light is disturbed to some extent.

Moreover, though the description has been made of the example of using the LED, in which the non-polar plane is used as the principal plane, as the light emitting element that emits the polarized light, a laser diode (LD) that has a higher polarization ratio can also be used as the light emitting element. In such a way, it can be expected that the light utilization efficiency is further enhanced.

What is claimed is:

1. A surface light emitting device comprising:
    a polarized light source that emits polarized light; and
    a light guide plate including a light incident surface on which the polarized light emitted from the polarized light source is made incident, and a light emitting surface that emits light, the light guide plate being made of light transmissive resin having low birefringence in which retardation is one-fourth or less of a wavelength of the polarized light.

2. The surface light emitting device of claim 1, wherein the light transmissive resin is a mixture of a positive birefringent substance and a negative birefringent substance.

3. The surface light emitting device of claim 2, wherein the positive birefringent substance is selected from polyvinylidene fluoride (PVDF), polyvinylidene fluoride trifluoroethylene (VDF·TrFE-58) and polyethylene oxide (PEO), and the negative birefringent substance is polymethyl methacrylate (PMMA).

4. The surface light emitting device of claim 1, wherein the light transmissive resin is a copolymer of a positive birefringent substance and a negative birefringent substance.

5. The surface light emitting device of claim 4, wherein the positive birefringent substance is selected from polyvinylidene fluoride (PVDF), polyvinylidene fluoride trifluoroethylene (VDF·TrFE-58) and polyethylene oxide (PEO), and the negative birefringent substance is polymethyl methacrylate (PMMA).

6. The surface light emitting device of claim 1, wherein the light transmissive resin is a polymer to which a low-molecular organic substance having a stick-like molecular shape and having anisotropy in polarizability is added.

7. The surface light emitting device of claim 1, wherein the light transmissive resin is a polymer to which inorganic birefringent crystal microparticles are added.

8. The surface light emitting device of claim 1, wherein the polarized light source is composed of a group III nitride semiconductor using a non-polar plane or a semi-polar plane as a principal plane, and
    the polarized light source includes a first conductive-type first semiconductor layer, a light emitting layer formed on the first semiconductor layer, and a second conductive-type second semiconductor layer formed on the light emitting layer.

9. The surface light emitting device of claim 1, wherein the polarized light source comprises:
    a light emitting element that emits the polarized light;
    a package base on which the light emitting element is mounted; and
    a sealing portion that is made of the light transmissive resin and covers the light emitting element.

10. The surface light emitting device of claim 1, wherein an absolute value of an inherent birefringence index of the light transmissive resin is $3 \times 10^{-3}$ or less.

11. A polarized light source comprising:
    a light emitting element that emits polarized light;
    a package base on which the light emitting element is mounted; and
    a sealing portion that is made of light transmissive resin having low birefringence in which retardation is one-fourth or less of a wavelength of the polarized light, and covers the light emitting element.

12. The polarized light source of claim 11, wherein the light transmissive resin is a mixture of a positive birefringent substance and a negative birefringent substance.

13. The polarized light source of claim 12, wherein the positive birefringent substance is selected from polyvinylidene fluoride (PVDF), polyvinylidene fluoride trifluoroethylene (VDF·TrFE-58) and polyethylene oxide (PEO), and the negative birefringent substance is polymethyl methacrylate (PMMA).

14. The polarized light source of claim 11, wherein the light transmissive resin is a copolymer of a positive birefringent substance and a negative birefringent substance.

15. The polarized light source of claim 14, wherein the positive birefringent substance is selected from polyvinylidene fluoride (PVDF), polyvinylidene fluoride trifluoroethylene (VDF·TrFE-58) and polyethylene oxide (PEO), and the negative birefringent substance is polymethyl methacrylate (PMMA).

16. The polarized light source of claim 11, wherein the light transmissive resin is a polymer to which a low-molecular organic substance having a stick-like molecular shape and having anisotropy in polarizability is added.

17. The polarized light source of claim 11, wherein the light transmissive resin is a polymer to which inorganic birefringent crystal microparticles are added.

18. The polarized light source of claim 11,
wherein the light emitting element is composed of a group III nitride semiconductor using a non-polar plane or a semi-polar plane as a principal plane, and
the light emitting element includes a first conductive-type first semiconductor layer, a light emitting layer formed on the first semiconductor layer, and a second conductive-type second semiconductor layer formed on the light emitting layer.

19. The polarized light source of claim 11, wherein an absolute value of an inherent birefringence index of the light transmissive resin is $3\times10^{-3}$ or less.

* * * * *